United States Patent
Yasuda

(10) Patent No.: US 10,084,430 B2
(45) Date of Patent: Sep. 25, 2018

(54) ELASTIC WAVE RESONATOR, BAND PASS FILTER, AND DUPLEXER

(71) Applicant: Murata Manufacturing Co., Ltd., Nagaokakyo-shi, Kyoto-fu (JP)

(72) Inventor: Junpei Yasuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 88 days.

(21) Appl. No.: 15/434,092

(22) Filed: Feb. 16, 2017

(65) Prior Publication Data

US 2017/0244383 A1    Aug. 24, 2017

(30) Foreign Application Priority Data

Feb. 19, 2016    (JP) .................. 2016-029715

(51) Int. Cl.
| | |
|---|---|
| *H03H 9/54* | (2006.01) |
| *H01Q 15/14* | (2006.01) |
| *H03H 9/02* | (2006.01) |
| *H03H 9/145* | (2006.01) |

(52) U.S. Cl.
CPC .............. *H03H 9/54* (2013.01); *H01Q 15/14* (2013.01); *H03H 9/02763* (2013.01); *H03H 9/02992* (2013.01); *H03H 9/14591* (2013.01)

(58) Field of Classification Search
CPC ...... H01Q 15/14; H03H 9/02992; H03H 9/54; H03H 9/02763; H03H 9/14591
See application file for complete search history.

(56) References Cited

U.S. PATENT DOCUMENTS

| | | | | |
|---|---|---|---|---|
| 2006/0145568 | A1* | 7/2006 | Morita | H03H 9/02551 310/313 A |
| 2006/0244550 | A1* | 11/2006 | Inoue | H03H 9/0038 333/133 |
| 2011/0043075 | A1* | 2/2011 | Okumichi | H03H 9/02763 310/313 B |
| 2011/0095844 | A1* | 4/2011 | Tanaka | H03H 9/0085 333/133 |
| 2011/0309896 | A1* | 12/2011 | Loseu | H03H 9/64 333/195 |
| 2012/0262246 | A1* | 10/2012 | Yasuda | H03H 9/0038 333/5 |

(Continued)

FOREIGN PATENT DOCUMENTS

WO    2015/033891 A1    3/2015

*Primary Examiner* — Jessica Han
*Assistant Examiner* — Jae Kim
(74) *Attorney, Agent, or Firm* — Keating & Bennett, LLP

(57) ABSTRACT

An elastic wave resonator includes a first, second and third reflectors. The first reflector is between a portion including a first IDT electrode and a third IDT electrode and a portion including a second IDT electrode and a fourth IDT electrode and is shared by the first to fourth IDT electrodes. The second reflector is shared by the first and third IDT electrodes. The third reflector is shared by the second and fourth IDT electrodes. The first and third IDT electrodes share a first common busbar. The second and fourth IDT electrodes share a second common busbar. The first and second common busbars are connected to the first reflector. A first busbar, a second busbar, a third busbar, and a fourth busbar of the respective first to fourth IDT electrodes are electrically connected to each other.

20 Claims, 3 Drawing Sheets

(56) References Cited

U.S. PATENT DOCUMENTS

| | | | |
|---|---|---|---|
| 2013/0141189 A1* | 6/2013 | Nishimura | H03H 9/64 333/195 |
| 2013/0249647 A1* | 9/2013 | Nakanishi | H03H 9/02559 333/186 |
| 2014/0049341 A1* | 2/2014 | Komatsu | H03H 9/14588 333/187 |
| 2016/0094201 A1* | 3/2016 | Takamine | H03H 9/0038 333/133 |
| 2016/0156334 A1* | 6/2016 | Nakagawa | H03H 9/6469 333/133 |

* cited by examiner

ELASTIC WAVE RESONATOR, BAND PASS FILTER, AND DUPLEXER

CROSS REFERENCE TO RELATED APPLICATIONS

This application claims the benefit of priority to Japanese Patent Application No. 2016-029715 filed on Feb. 19, 2016. The entire contents of this application are hereby incorporated herein by reference.

BACKGROUND OF THE INVENTION

1. Field of the Invention

The present invention relates to an elastic wave resonator and also relates to a band pass filter and a duplexer including the elastic wave resonator.

2. Description of the Related Art

To date, elastic wave resonators have been used for band pass filters and duplexers of cellular phones.

The elastic wave resonators have reflectors arranged across at least one interdigital transducer (IDT) electrode in an elastic-wave propagation direction. An elastic wave resonator described in International Publication 2015/033891 includes two IDT electrodes arranged in a direction orthogonal to the elastic-wave propagation direction. Each IDT electrode shares a common busbar serving as a busbar of the corresponding IDT electrode. When the common busbar is shared, waves generated between the two IDT electrodes are coupled, and structural symmetry is thus improved. Nonlinear distortion can thus be reduced.

In recent years, an effort to obtain better filter characteristics has led to a larger size in an elastic-wave propagation direction of an IDT electrode of an elastic wave resonator and has also led to a longer busbar. Also in the elastic wave resonator described in International Publication No. 2015/033891, enhancement of the filter characteristics involves a longer common busbar. This increases line resistance, and insertion loss thus tends to be increased.

SUMMARY OF THE INVENTION

Preferred embodiments of the present invention provide an elastic wave resonator, a band pass filter, and a duplexer that significantly reduce line resistance and significantly reduce or prevent insertion loss.

According to a preferred embodiment of the present invention, an elastic wave resonator includes a piezoelectric substrate, a first interdigital transducer electrode, a second interdigital transducer electrode, a third interdigital transducer electrode, a fourth interdigital transducer electrode, a first reflector, a second reflector, and a third reflector. The first interdigital transducer electrode and the second interdigital transducer electrode are arranged on the piezoelectric substrate in an elastic-wave propagation direction with a gap located between the first interdigital transducer electrode and the second interdigital transducer electrode. The third interdigital transducer electrode and the fourth interdigital transducer electrode are arranged on the piezoelectric substrate in the elastic-wave propagation direction with a gap located between the third interdigital transducer electrode and the fourth interdigital transducer electrode. The third interdigital transducer electrode and the fourth interdigital transducer electrode respectively face the first interdigital transducer electrode and the second interdigital transducer electrode in a direction orthogonal or substantially orthogonal to the elastic-wave propagation direction. The first reflector is disposed between the first interdigital transducer electrode and the second interdigital transducer electrode and between the third interdigital transducer electrode and the fourth interdigital transducer electrode. The first reflector is shared by the first interdigital transducer electrode to the fourth interdigital transducer electrode. The second reflector and the first reflector sandwich the first interdigital transducer electrode and the third interdigital transducer electrode in the elastic-wave propagation direction. The second reflector is shared by the first interdigital transducer electrode and the third interdigital transducer electrode. The third reflector and the first reflector sandwich the second interdigital transducer electrode and the fourth interdigital transducer electrode in the elastic-wave propagation direction. The third reflector is shared by the second interdigital transducer electrode and the fourth interdigital transducer electrode. The first interdigital transducer electrode, the second interdigital transducer electrode, the third interdigital transducer electrode, and the fourth interdigital transducer electrode respectively include a first busbar, a second busbar, a third busbar, and a fourth busbar. The first interdigital transducer electrode and the third interdigital transducer electrode share a first common busbar. The second interdigital transducer electrode and the fourth interdigital transducer electrode share a second common busbar. The first busbar, the second busbar, the third busbar, and the fourth busbar are electrically connected to each other.

In an elastic wave resonator according to a preferred embodiment of the present invention, the first common busbar and the second common busbar are connected to the first reflector, the first busbar and the third busbar are connected to the second reflector, and the second busbar and the fourth busbar are connected to the third reflector. The elastic wave resonator further includes a first signal terminal electrically connected to the first reflector and a second signal terminal electrically connected to the first busbar, the second busbar, the third busbar, and the fourth busbar.

In an elastic wave resonator according to a preferred embodiment of the present invention, the first common busbar and the second common busbar have identical or substantially identical lengths. In this case, each of the lengths of the first and second common busbars is able to be significantly reduced. The line resistance of the elastic wave resonator is able to be further reduced.

In an elastic wave resonator according to a preferred embodiment of the present invention, the first reflector includes a plurality of electrode fingers and a common-busbar extension that extends to connect all of the electrode fingers of the first reflector to each other, and the common-busbar extension connects the first common busbar and the second common busbar. In this case, the number of signal transmission paths is able to be significantly increased, and the line resistance of the elastic wave resonator is able to be further reduced.

In an elastic wave resonator according to a preferred embodiment of the present invention, the second reflector includes a plurality of electrode fingers and a first common connection that extends to connect all of the electrode fingers of the second reflector to each other. The third reflector includes a plurality of electrode fingers and a second common connection that extends to connect all of the electrode fingers of the third reflector to each other. In this case, each electrical resistance of the second reflector and the third reflector is able to be significantly reduced. The line resistance of the elastic wave resonator is able to be significantly reduced or prevented.

In an elastic wave resonator according to a preferred embodiment of the present invention, in a case where a direction orthogonal or substantially orthogonal to a direction in which the first common busbar, the second common busbar, the first busbar, the second busbar, the third busbar, and the fourth busbar extend is a direction of a width of each of the first common busbar, the second common busbar, the first busbar, the second busbar, the third busbar, and the fourth busbar, the width of the first common busbar is narrower than the width of at least one of the first busbar and the third busbar, and the width of the second common busbar is narrower than the width of at least one of the second busbar and the fourth busbar. In this case, the elastic wave resonator is able to be reduced in size.

In an elastic wave resonator according to a preferred embodiment of the present invention, the first common busbar and the second common busbar are thinner than the first busbar, the second busbar, the third busbar, and the fourth busbar. In this case, materials for the elastic wave resonator are able to be significantly reduced.

In an elastic wave resonator according to a preferred embodiment of the present invention, the first interdigital transducer electrode includes a plurality of electrode fingers that are interdigitated with each other. The second interdigital transducer electrode, the third interdigital transducer electrode, and the fourth interdigital transducer electrode each include a plurality of electrode fingers that are interdigitated with each other. In a case where a width of a portion in which the electrode fingers adjacent to or in a vicinity of each other of the first interdigital transducer electrode overlap when viewed in the elastic-wave propagation direction is set as an interdigital width of the first interdigital transducer electrode and where a width of a portion in which the electrode fingers adjacent to or in a vicinity of each other of each of the second interdigital transducer electrode, the third interdigital transducer electrode, and the fourth interdigital transducer electrode overlap when viewed in the elastic-wave propagation direction is set as an interdigital width of a corresponding one of the second interdigital transducer electrode, the third interdigital transducer electrode, and the fourth interdigital transducer electrode, the length of the first common busbar is greater than a sum of the interdigital width of each of the first interdigital transducer electrode and the third interdigital transducer electrode, and the length of the second common busbar is greater than a sum of the interdigital width of each of the second interdigital transducer electrode and the fourth interdigital transducer electrode. In this case, the electrical resistance of the first to fourth IDT electrodes is able to be further reduced.

In an elastic wave resonator according to a preferred embodiment of the present invention, electrical resistance of the first reflector is lower than electrical resistance of each of the first common busbar and the second common busbar. In this case, the electrical resistance of not only the first and second common busbars but also the first reflector is low, the insertion loss is able to be further reduced or prevented.

In an elastic wave resonator according to a preferred embodiment of the present invention, the first reflector includes the plurality of electrode fingers, and a volume of each of the first common busbar and the second common busbar is smaller than a sum of a volume of all of the electrode fingers of the first reflector. In this case, the electrical resistance of not only the first and second common busbars but also the first reflector is low, the insertion loss is able to be further reduced or prevented. Further, the elastic wave resonator is able to be reduced in size.

A band pass filter according to a preferred embodiment of the present invention includes a first filter portion that is the elastic wave resonator of a preferred embodiment of the present invention, at least one second filter portion other than the first filter portion, and an input terminal. The first filter portion is disposed closest to the input terminal.

A duplexer according to a preferred embodiment of the present invention includes a first band-pass filter, a second band-pass filter, and an antenna terminal. The first band-pass filter includes a first filter portion and at least one second filter portion other than the first filter portion. The first filter portion is the elastic wave resonator of a preferred embodiment of the present invention. The second band-pass filter has a pass band different from a pass band of the first band-pass filter. The antenna terminal is connected to the first band-pass filter, the second band-pass filter, and an antenna. The first filter portion in the first band-pass filter is disposed closest to the antenna terminal.

Preferred embodiments of the present invention provide an elastic wave resonator, a band pass filter, and a duplexer that significantly reduce line resistance and significantly reduce or prevent insertion loss.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified through description of specific preferred embodiments of the present invention with reference to the drawings.

It should be noted that the preferred embodiments described in the specification are provided for illustrative purposes and the configurations in the respective preferred embodiments may be partially replaced or combined with each other.

Figure 1:
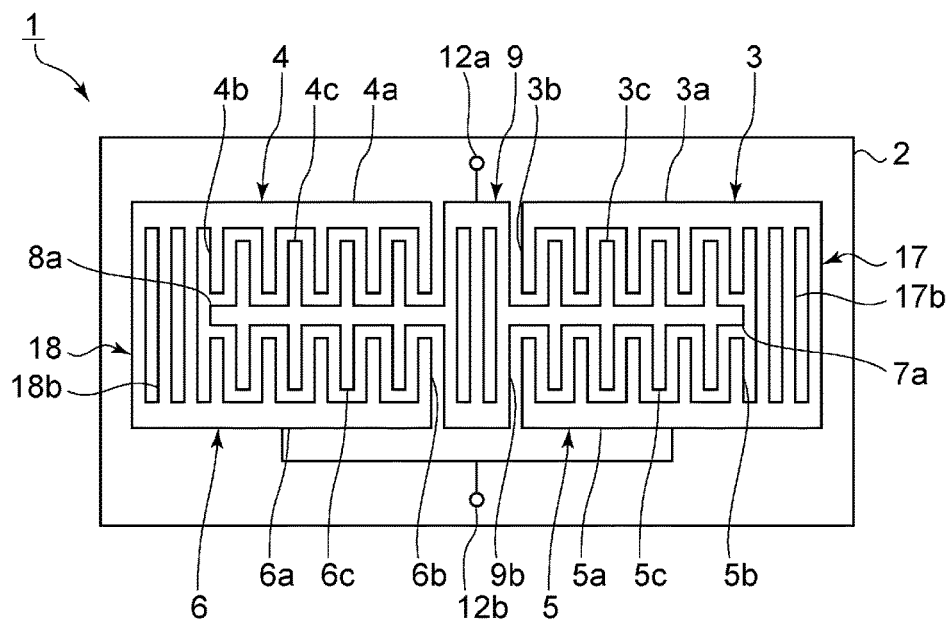
FIG. 1 is a schematic plan view showing electrodes of an elastic wave resonator according to a first preferred embodiment of the present invention.

FIG. 1 is a schematic plan view showing electrodes of an elastic wave resonator according to a first preferred embodiment of the present invention.

An elastic wave resonator 1 includes a piezoelectric substrate 2. The piezoelectric substrate 2 is preferably formed of a piezoelectric single crystal, for example, $LiTaO_3$ or $LiNbO_3$. The piezoelectric substrate 2 may include any piezoelectric ceramics.

A first IDT electrode 3, a second IDT electrode 4, a third IDT electrode 5, and a fourth IDT electrode 6 are disposed on the piezoelectric substrate 2. The first IDT electrode 3 and the second IDT electrode 4 are arranged in an elastic-wave propagation direction with a gap located therebetween. The third IDT electrode 5 and the fourth IDT electrode 6 are arranged in the elastic-wave propagation direction with a gap located therebetween. The third and fourth IDT electrodes 5 and 6 respectively face the first and second IDT electrodes 3 and 4 in a direction orthogonal or substantially orthogonal to the elastic-wave propagation direction.

In the first preferred embodiment, one IDT electrode is divided into two IDT electrodes, corresponding to the first and second IDT electrodes 3 and 4. Likewise, one IDT electrode is divided into two IDT electrodes, corresponding to the third and fourth IDT electrodes 5 and 6.

The first to fourth IDT electrodes 3 to 6 respectively include a first busbar 3a, a second busbar 4a, a third busbar 5a, and a fourth busbar 6a. The first and third IDT electrodes 3 and 5 share a first common busbar 7a. The first and third busbars 3a and 5a sandwich the first common busbar 7a.

The second and fourth IDT electrodes 4 and 6 share a second common busbar 8a. The second and fourth busbars 4a and 6a sandwich the second common busbar 8a. In the first preferred embodiment, the first and second common busbars 7a and 8a have identical or substantially identical lengths.

The first IDT electrode 3 includes a plurality of first electrode fingers 3b and a plurality of second electrode fingers 3c. The first electrode fingers 3b are interdigitated with the second electrode fingers 3c. More specifically, one end of each first electrode finger 3b is connected to the first busbar 3a, and one end of each second electrode finger 3c is connected to the first common busbar 7a.

The second IDT electrode 4 includes a plurality of first electrode fingers 4b and a plurality of second electrode fingers 4c. The first electrode fingers 4b are interdigitated with the second electrode fingers 4c. The third IDT electrode 5 includes a plurality of first electrode fingers 5b and a plurality of second electrode fingers 5c. The first electrode fingers 5b are interdigitated with the second electrode fingers 5c. The fourth IDT electrode 6 includes a plurality of first electrode fingers 6b and a plurality of second electrode fingers 6c. The first electrode fingers 6b are interdigitated with the second electrode fingers 6c. In the second IDT electrode 4, one end of each first electrode finger 4b is connected to the second busbar 4a. One end of each second electrode finger 4c is connected to the second common busbar 8a. In the third IDT electrode 5, one end of each first electrode finger 5b is connected to the third busbar 5a, and one end of each second electrode finger 5c is connected to the first common busbar 7a. In the fourth IDT electrode 6, one end of each first electrode finger 6b is connected to the fourth busbar 6a, and one end of each second electrode finger 6c is connected to the second common busbar 8a.

The first and third IDT electrodes 3 and 5 are arranged on an opposite side of a first reflector 9 from the second and fourth IDT electrodes 4 and 6. The first reflector 9 is shared by the first to fourth IDT electrodes 3 to 6. The first reflector 9 includes a plurality of electrode fingers 9b. The first and second common busbars 7a and 8a are connected to the first reflector 9. The connected first and second common busbars 7a and 8a have the same or substantially the same potential.

A second reflector 17 and the first reflector 9 sandwich the first and third IDT electrodes 3 and 5 in the elastic-wave propagation direction. The second reflector 17 is shared by the first and third IDT electrodes 3 and 5. The second reflector 17 includes a plurality of electrode fingers 17b. The first and third busbars 3a and 5a are connected to the second reflector 17. The connected first and third busbars 3a and 5a have the same or substantially the same potential. In contrast, the first common busbar 7a has a different potential from the potential of the connected first and third busbars 3a and 5a.

The piezoelectric substrate 2, the first IDT electrode 3, the first reflector 9, and the second reflector 17 define a first elastic-wave-resonator portion. Likewise, the piezoelectric substrate 2, the third IDT electrode 5, the first reflector 9, and the second reflector 17 define a third elastic-wave-resonator portion. The first and third elastic-wave-resonator portions are connected parallel or substantially parallel to each other. In other words, one elastic wave resonator is divided into the first and third elastic-wave-resonator portions disposed parallel or substantially parallel to each other.

A third reflector 18 and the first reflector 9 sandwich the second and fourth IDT electrodes 4 and 6 in the elastic-wave propagation direction. The third reflector 18 is shared by the second and fourth IDT electrodes 4 and 6. The third reflector 18 includes a plurality of electrode fingers 18b. The second and fourth busbars 4a and 6a are connected to the third reflector 18. The connected second and fourth busbars 4a and 6a have the same or substantially the same potential. In contrast, the second common busbar 8a has a different potential from the potential of the connected second and fourth busbars 4a and 6a.

The piezoelectric substrate 2, the second IDT electrode 4, the first reflector 9, and the third reflector 18 define a second elastic-wave-resonator portion. The piezoelectric substrate 2, the fourth IDT electrode 6, the first reflector 9, and the third reflector 18 define a fourth elastic-wave-resonator portion. The second and fourth elastic-wave-resonator portions are connected parallel or substantially parallel to each other. One elastic wave resonator is divided into the second and fourth elastic-wave-resonator portions disposed parallel or substantially parallel to each other.

The elastic wave resonator 1 includes a first signal terminal 12a and a second signal terminal 12b. The first signal terminal 12a is connected to the first reflector 9. The first and second common busbars 7a and 8a, which are connected to each other through the first reflector 9 and the first signal terminal 12a, have the same or substantially the same potential. In contrast, the second signal terminal 12b is connected to the third and fourth busbars 5a and 6a. The first to fourth busbars 3a to 6a connected to each other through the second signal terminal 12b have a different potential from the potential of the first and second common busbars 7a and 8a. As described above, the elastic wave resonator 1 is an elastic wave resonator divided into two portions disposed parallel or substantially parallel to each other: the first and third elastic-wave-resonator portions; and the second and fourth elastic-wave-resonator portions. When the elastic wave resonator is divided into the two portions that are the first and third elastic-wave-resonator portions and the second and fourth elastic-wave-resonator portions, halves of one common busbar respectively correspond to the first and second common busbars 7a and 8a.

FIG. 1 schematically shows the elastic wave resonator 1, and, for example, the Table 1 includes examples of approximate values of the first to fourth IDT electrodes 3 to 6, the first reflector 9, and the second and third reflectors 17 and 18 in the first preferred embodiment.

TABLE 1

| | The number of pairs of IDT electrode fingers (pairs) | The number of reflector electrode fingers (fingers) | Interdigital width (μm) | Pitch of electrode fingers (μm) |
|---|---|---|---|---|
| First IDT electrode 3 | 45 | — | 50 | 2.48 |
| Second IDT electrode 4 | 45 | — | 50 | 2.48 |
| Third IDT electrode 5 | 45 | — | 50 | 2.48 |
| Fourth IDT electrode 6 | 45 | — | 50 | 2.48 |
| First reflector 9 | — | 15 | — | 2.48 |
| Second reflector 17 | — | 15 | — | 2.48 |
| Third reflector 18 | — | 15 | — | 2.48 |

According to the first preferred embodiment, the first reflector 9 is arranged between the first IDT electrode 3 and the second IDT electrode 4 that results from the division, and between the third IDT electrode 5 and the fourth IDT electrode 6 that results from the division, and the first and second common busbars 7a and 8a are connected to the first reflector 9. The electrical resistance of the first and second common busbars 7a and 8a is able to be significantly reduced, and insertion loss of the elastic wave resonator 1 is able to be significantly reduced or prevented. These specific features are described below by comparing the first preferred embodiment with a comparative example.

Figure 2:
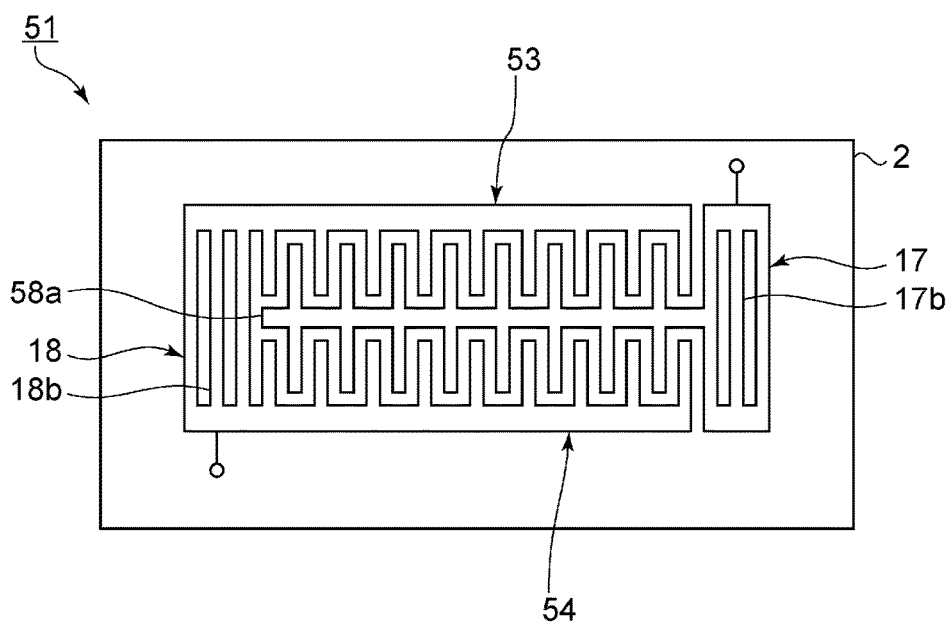
FIG. 2 is a schematic plan view showing electrodes of an elastic wave resonator according to a comparative example.

FIG. 2 is a schematic plan view showing electrodes of an elastic wave resonator according to the comparative example.

An elastic wave resonator 51 in the comparative example is different from the elastic wave resonator 1 in the first preferred embodiment in that the elastic wave resonator 51 of the comparative example does not include a first reflector. A first IDT electrode 53 and a second IDT electrode 54 of the comparative example share a common busbar 58a. The common busbar 58a of the comparative example is as long as the sum of the length of each of the first and second common busbars 7a and 8a in the first preferred embodiment.

Elastic wave resonators according to, respectively, the first preferred embodiment and the comparative example were manufactured, and insertion losses thereof were compared with each other.

Figure 3:
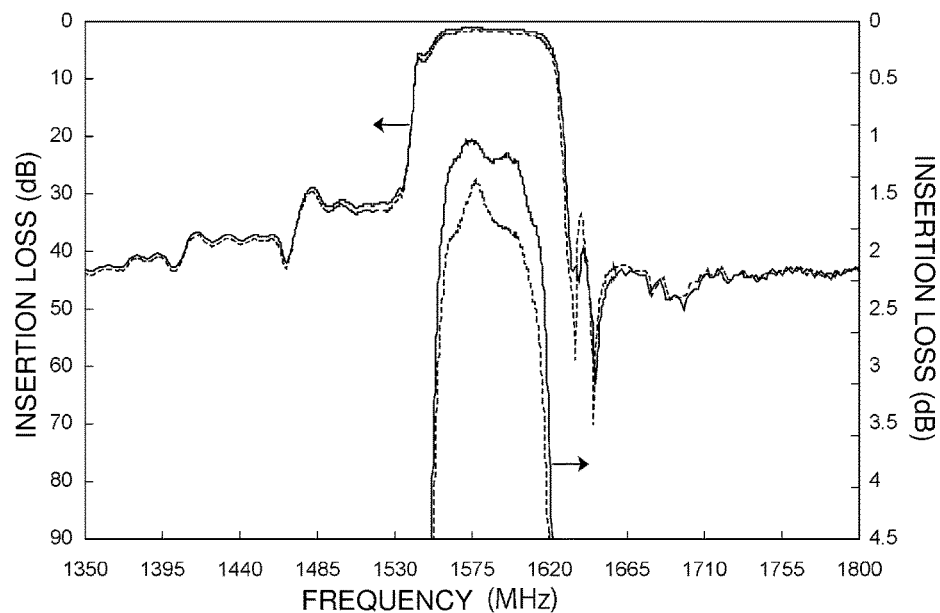
FIG. 3 is a graph showing attenuation frequency characteristics of the elastic wave resonators in the first preferred embodiment and the comparative example, respectively.

FIG. 3 is a graph showing attenuation frequency characteristics of the elastic wave resonators in the first preferred embodiment and the comparative example, respectively. Solid lines represent results in the first preferred embodiment, and broken lines represent results in the comparative example.

As shown in FIG. 3, the first preferred embodiment provides a smaller insertion loss than the comparative example. The common busbar in the comparative example is longer than each of the first and second common busbars in the first preferred embodiment. Accordingly, the common busbar in the comparative example has a higher electrical resistance than each of the first and second common busbars of the first preferred embodiment. Accordingly, the elastic wave resonator in the comparative example is likely to have large insertion loss.

In contrast, the elastic wave resonator in the first preferred embodiment is divided into two portions disposed in parallel or substantially in parallel to each other, that is, the portion including the first and third elastic-wave-resonator portions and the portion including the second and fourth elastic-wave-resonator portions, and each of the first and second common busbars thereof is, therefore, short. In the first preferred embodiment, the first and second common busbars preferably are each about half the length of the common busbar in the comparative example. Accordingly, the line resistance of the elastic wave resonator is able to be significantly reduced, and the insertion loss is able to be significantly reduced or prevented.

Note that the first and second common busbars may respectively have different lengths. However, setting the same or substantially the same length for the first and second common busbars is able to provide a significant reduction in length of each of the first and second common busbars. The electrical resistance of each of the first and second common busbars is able to be significantly reduced.

Referring back to FIG. 1, in the first preferred embodiment, the first and third IDT electrodes 3 and 5 share the first common busbar 7a, and the second and fourth IDT electrodes 4 and 6 share the second common busbar 8a. This configuration not only provides the advantageous effects described above but also enables nonlinear distortion to be significantly reduced or prevented due to structural symmetry. More specifically, sharing each common busbar by the corresponding two IDT electrodes provides wave coupling between the IDT electrodes sharing the busbar.

Note that the width of each of the first and second common busbars 7a and 8a and the first to fourth busbars 3a to 6a preferably extends in a direction orthogonal or substantially orthogonal to the direction in which the first and second common busbars 7a and 8a and the first to fourth busbars 3a to 6a extend. In this case, the first common busbar 7a preferably has a narrower width than at least one of the first and third busbars 3a and 5a. Further, the second common busbar 8a preferably has a narrower width than at least one of the second and fourth busbars 4a and 6a. The first common busbar 7a more preferably has a narrower width than each of the first and third busbars 3a and 5a. Further, the second common busbar 8a preferably has a narrower width than each of the second and fourth busbars 4a and 6a.

A narrow width of the first and second common busbars 7a and 8a provides a high electrical resistance of the first and second common busbars 7a and 8a. However, in the first preferred embodiment as described above, the electrical resistance of the first and second common busbars 7a and 8a is able to be significantly reduced. Accordingly, the elastic wave resonator 1 is able to be reduced in size, and the insertion loss is able to be significantly reduced or prevented.

The first and second common busbars 7a and 8a may be thinner than the first to fourth busbars 3a to 6a. More specifically, for example, the number of electrode layers that are included in each of the first and second common busbars 7a and 8a may be smaller than the number of electrode layers that are included in each of the first to fourth busbars 3a to 6a. In this case, materials for the elastic wave resonator 1 are able to be significantly reduced. Note that the first and second common busbars 7a and 8a and the first to fourth busbars 3a to 6a may each be defined by a single-layer metal film or laminated metal films.

Note that the electrode fingers of the first IDT electrode 3 are viewed in the elastic-wave propagation direction, and the width of a portion in which the electrode fingers adjacent to or in a vicinity of each other overlap is set as an interdigital width of the first IDT electrode 3. Likewise, the electrode fingers of each of the second to fourth IDT electrodes 4 to 6 are viewed in the elastic-wave propagation direction, and the width of a portion in which the electrode fingers adjacent to or in a vicinity of each other overlap is set as an interdigital width of a corresponding one of the second to fourth IDT electrodes 4 to 6.

In this case, the first common busbar 7a is preferably longer than the sum of the interdigital width of each of the first and third IDT electrodes 3 and 5. Further, the second common busbar 8a is preferably longer than the sum of the interdigital width of each of the second and fourth IDT electrodes 4 and 6. In this case, the lengths of the first electrode fingers 3b to 6b and the second electrode fingers 3c to 6c of the first to fourth IDT electrodes 3 to 6 are able to be decreased. Accordingly, the electrical resistance of the first to fourth IDT electrodes 3 to 6 is able to be further reduced.

The electrical resistance of the first reflector 9 may be lower than the electrical resistance of each of the first and second common busbars 7a and 8a. More specifically, for example, the volume of each of the first and second common busbars 7a and 8a may be smaller than the sum of the volume of all of the electrode fingers 9b of the first reflector 9. In addition to the low electrical resistance of each of the first and second common busbars 7a and 8a, the low electrical resistance of the first reflector 9 is able to further reduce or prevent the insertion loss. Further, the elastic wave resonator 1 is able to be reduced in size.

In the first preferred embodiment, the first and third busbars 3a and 5a are connected to the second reflector 17, and the second and fourth busbars 4a and 6a are connected to the third reflector 18. Further, the third and fourth busbars 5a and 6a are connected to the second signal terminal 12b. The elastic wave resonator 1 is not limited to the configuration described above. According to a preferred embodiment of the present invention, the first to fourth busbars 3a to 6a only need to be electrically connected to each other, for example.

According to a preferred embodiment of the present invention, the first signal terminal 12a is electrically connected only to the first reflector 9 and is not directly or physically connected to the first reflector 9. By connecting the first signal terminal 12a to the first reflector 9 a reduction in size of the elastic wave resonator 1 is able to be provided.

Figure 4:
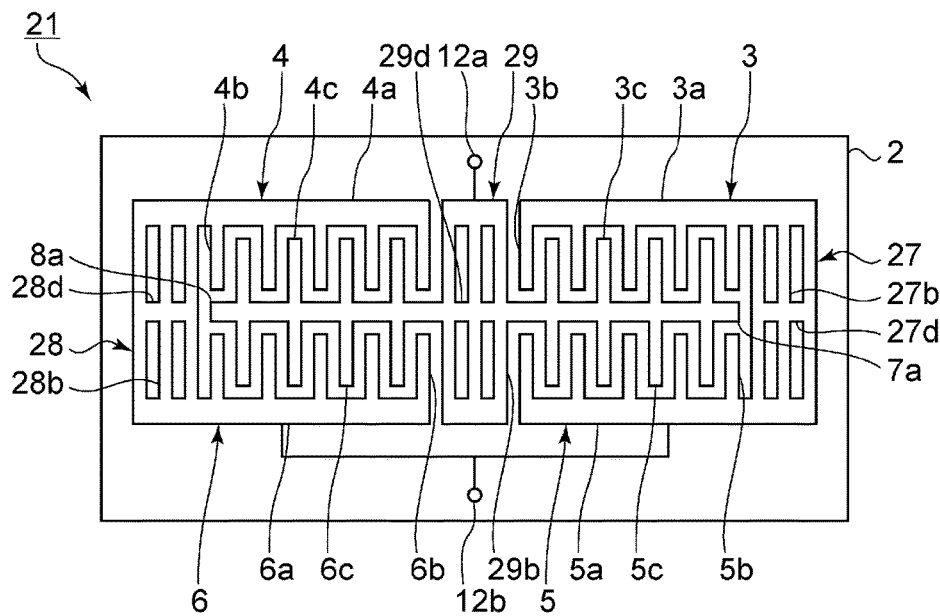
FIG. 4 is a schematic plan view showing electrodes of an elastic wave resonator according to a second preferred embodiment of the present invention.

FIG. 4 is a schematic plan view showing electrodes of an elastic wave resonator according to a second preferred embodiment of the present invention.

An elastic wave resonator 21 is different from the elastic wave resonator 1 in the first preferred embodiment in that a first reflector 29 includes a common-busbar extension 29d and that a second reflector 27 and a third reflector 28 respectively have a first common connection 27d and a second common connection 28d. The elastic wave resonator 21 is otherwise similar to or the same as the elastic wave resonator 1 in the first preferred embodiment.

More specifically, in the first reflector 29, the common-busbar extension 29d is located on a line on which the first and second common busbars 7a and 8a are extended lengthwise. The common-busbar extension 29d extends to connect all of electrode fingers 29b of the first reflector 29. The common-busbar extension 29d connects the first and second common busbars 7a and 8a.

As described above, all of the electrode fingers 29b of the first reflector 29 are connected to the first and second common busbars 7a and 8a with the common-busbar extension 29d located therebetween. The configuration enables the number of signal transmission paths to be significantly increased and the line resistance thus to be further reduced. Accordingly, the insertion loss is able to be further reduced or prevented.

The first common connection 27d extends to connect all of electrode fingers 27b of the second reflector 27. Likewise, the second common connection 28d extends to connect all of electrode fingers 28b of the third reflector 28. In the second preferred embodiment, the first and second common connections 27d and 28d extend along the extended line from the first and second common busbars 7a and 8a. Note that the arrangement of the first and second common connections 27d and 28d is not limited to the arrangement described above.

Since the first and second common connections 27d and 28d connect all of the electrode fingers 27b and 28b, the electrical resistance of the second and third reflectors 27 and 28 is able to be significantly reduced. The line resistance of the elastic wave resonator 21 is able to be significantly reduced.

Although the elastic wave resonators 1 and 21 have been respectively described in the first and second preferred embodiments, preferred embodiments of the present invention are applicable to a band pass filter, a duplexer, and other devices that include these elastic wave resonators.

Figure 5:
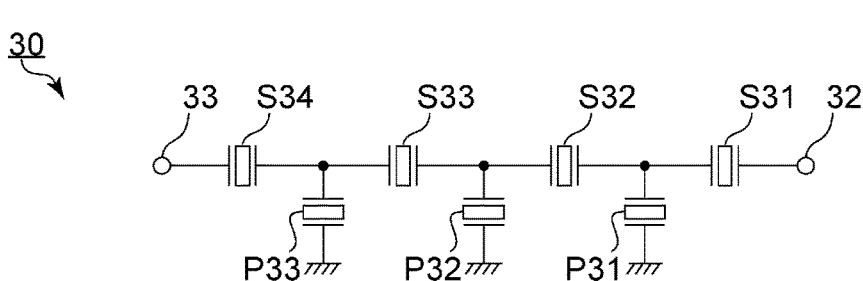
FIG. 5 is a circuit diagram of a band pass filter according to a third preferred embodiment of the present invention.

FIG. 5 is a circuit diagram of a band pass filter according to a third preferred embodiment of the present invention.

A band pass filter 30 is a ladder filter including an input terminal 32, an output terminal 33, a plurality of serial arm resonators S31, S32, S33, and S34, and a plurality of parallel arm resonators P31, P32, and P33. A signal is input into the input terminal 32 and is output from the output terminal 33.

More specifically, the serial arm resonators S31 to S34 are connected in series between the input terminal 32 and the output terminal 33. Among the serial arm resonators S31 to S34 and the parallel arm resonators P31 to P33, the serial arm resonator S31 is disposed closest to the input terminal 32. The serial arm resonator S31 is an elastic wave resonator with a structure that is the same as or similar to the elastic wave resonator 1 in the first preferred embodiment. The serial arm resonator S31 corresponds to a first filter portion in preferred embodiments of the present invention, and the serial arm resonators S32 to S34 and the parallel arm resonators P31 to P33 correspond to a second filter portion in preferred embodiments of the present invention.

The parallel arm resonator P31 is connected between a connection between the serial arm resonator S31 and the serial arm resonator S32 and a ground potential. The parallel arm resonator P32 is connected between a connection between the serial arm resonator S32 and the serial arm resonator S33 and a ground potential. The parallel arm resonator P33 is connected between a connection between the serial arm resonator S33 and the serial arm resonator S34 and a ground potential.

Since the band pass filter 30 includes the serial arm resonator S31 with a structure that is the same as or similar to the elastic wave resonator 1, the line resistance is able to be significantly reduced. The insertion loss is able to be significantly reduced or prevented. Further, since the serial arm resonator S31 is disposed closest to the input terminal 32, the nonlinear distortions are able to be significantly reduced.

According to a modification of the preferred embodiments of the present invention, only one of the serial arm resonators S31 to S34 and the parallel arm resonators P31 to P33 is configured the same as or similar to the elastic wave resonator of one of the preferred embodiments of the present invention. In addition, the band pass filter 30 is not limited to the ladder filter. According to a preferred embodiment of the present invention, only the band pass filter 30 includes the first filter portion and at least one second filter portion other than the first filter portion, the first filter portion being configured the same as or similar to the elastic wave resonator in one of the preferred embodiments of the present invention.

Figure 6:
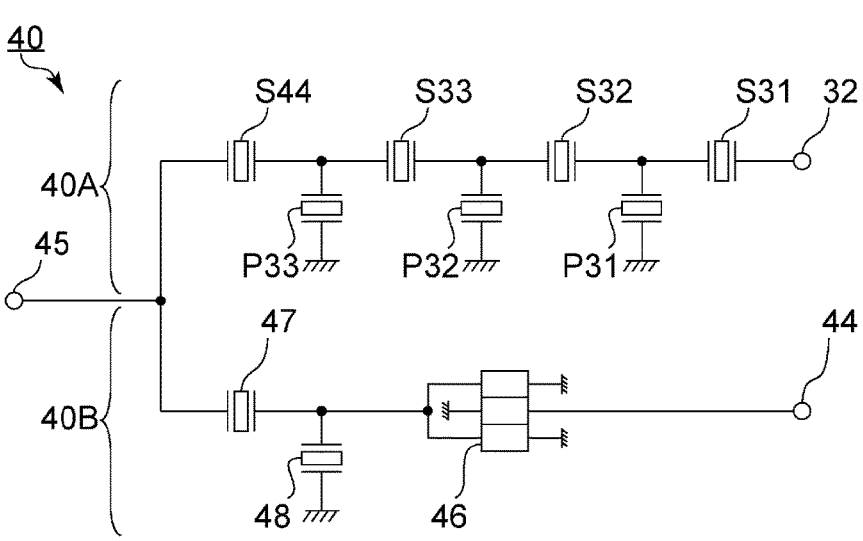
FIG. 6 is a circuit diagram of a duplexer according to a fourth preferred embodiment of the present invention.

FIG. 6 is a circuit diagram of a duplexer according to a fourth preferred embodiment of the present invention.

A duplexer 40 includes a first band-pass filter 40A and a second band-pass filter 40B having a pass band different from the pass band of the first band-pass filter 40A. The duplexer 40 includes an antenna terminal 45 connected to the first and second band-pass filters 40A and 40B and an antenna. In the duplexer 40, the first band-pass filter 40A is a transmission filter, and the second band-pass filter 40B is a reception filter.

The first band-pass filter 40A is different from the band pass filter 30 in the third preferred embodiment in that the serial arm resonator S44 disposed closest to the antenna terminal 45 is an elastic wave resonator configured the same as or similar to the elastic wave resonator 1 in the first preferred embodiment. The first band-pass filter 40A is otherwise similar to or the same as the band pass filter 30 in the third preferred embodiment. In the first band-pass filter 40A, not only the serial arm resonator S31 but also the serial arm resonator S44 corresponds to the first filter portion in preferred embodiments of the present invention.

The second band-pass filter 40B includes an output terminal 44, a longitudinally coupled resonator-type elastic wave filter 46, and resonators 47 and 48. The longitudinally coupled resonator-type elastic wave filter 46 is connected between the antenna terminal 45 and the output terminal 44. The resonator 47 is connected between the antenna terminal 45 and the longitudinally coupled resonator-type elastic wave filter 46. The resonator 48 is connected between a connection between the resonator 47 and the longitudinally coupled resonator-type elastic wave filter 46 and a ground potential.

The resonator 47 is disposed closest to the antenna terminal 45 in the second band-pass filter 40B. The resonator is an elastic wave resonator configured the same as or similar to the elastic wave resonator 1 in the first preferred embodiment. The resonator 47 corresponds to the first filter portion in preferred embodiments of the present invention. The resonator 48 and the longitudinally coupled resonator-type elastic wave filter 46 correspond to the second filter portion in preferred embodiments of the present invention.

In the fourth preferred embodiment, the first and second band-pass filters 40A and 40B respectively include the first filter portions. In addition, the first filter portions are disposed closest to the antenna terminal 45 connected to and shared by the first and second band-pass filters 40A and 40B. This is able to significantly reduce the nonlinear distortions. Further, as in the first preferred embodiment, the line resistance is able to be significantly reduced, and the insertion loss is able to be significantly reduced or prevented.

According to a preferred embodiment of the present invention, only one of the first and second band-pass filters 40A and 40B includes the at least one first filter portion. Any circuit configuration may be included for the first and second band-pass filters 40A and 40B.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave resonator comprising:
    a piezoelectric substrate;
    a first interdigital transducer electrode and a second interdigital transducer electrode that are arranged on the piezoelectric substrate in an elastic-wave propagation direction with a gap located between the first interdigital transducer electrode and the second interdigital transducer electrode;
    a third interdigital transducer electrode and a fourth interdigital transducer electrode that are arranged on the piezoelectric substrate in the elastic-wave propagation direction with a gap located between the third interdigital transducer electrode and the fourth interdigital transducer electrode, the third interdigital transducer electrode and the fourth interdigital transducer electrode respectively facing the first interdigital transducer electrode and the second interdigital transducer electrode in a direction orthogonal or substantially orthogonal to the elastic-wave propagation direction;
    a first reflector disposed between the first interdigital transducer electrode and the second interdigital transducer electrode and between the third interdigital transducer electrode and the fourth interdigital transducer electrode, the first reflector being shared by the first interdigital transducer electrode to the fourth interdigital transducer electrode;
    a second reflector shared by the first interdigital transducer electrode and the third interdigital transducer electrode; and
    a third reflector shared by the second interdigital transducer electrode and the fourth interdigital transducer electrode; wherein
    the second reflector and the first reflector sandwich the first interdigital transducer electrode and the third interdigital transducer electrode in the elastic-wave propagation direction;
    the third reflector and the first reflector sandwich the second interdigital transducer electrode and the fourth interdigital transducer electrode in the elastic-wave propagation direction;
    the first interdigital transducer electrode, the second interdigital transducer electrode, the third interdigital transducer electrode, and the fourth interdigital transducer electrode respectively include a first busbar, a second busbar, a third busbar, and a fourth busbar, the first interdigital transducer electrode and the third interdigital transducer electrode share a first common busbar, and the second interdigital transducer electrode and the fourth interdigital transducer electrode share a second common busbar; and
    the first busbar, the second busbar, the third busbar, and the fourth busbar are electrically connected to each other.

2. The elastic wave resonator according to claim 1, wherein:
    the first common busbar and the second common busbar are connected to the first reflector, the first busbar and the third busbar are connected to the second reflector, and the second busbar and the fourth busbar are connected to the third reflector; and
    the elastic wave resonator further includes:
        a first signal terminal electrically connected to the first reflector; and a second signal terminal electrically connected to the first busbar, the second busbar, the third busbar, and the fourth busbar.

3. The elastic wave resonator according to claim 2, wherein the first signal terminal is not physically connected to the first reflector.

4. The elastic wave resonator according to claim 1, wherein the first common busbar and the second common busbar have identical or substantially identical lengths.

5. The elastic wave resonator according to claim 1, wherein the first reflector includes a plurality of electrode fingers and a common-busbar extension that extends to connect all of the electrode fingers of the first reflector to each other, and the common-busbar extension connects the first common busbar and the second common busbar.

6. The elastic wave resonator according to claim 1, wherein:
the second reflector includes a plurality of electrode fingers and a first common connection that extends to connect all of the electrode fingers of the second reflector to each other; and
the third reflector includes a plurality of electrode fingers and a second common connection that extends to connect all of the electrode fingers of the third reflector to each other.

7. The elastic wave resonator according to claim 1, wherein, a direction orthogonal or substantially orthogonal to a direction in which the first common busbar, the second common busbar, the first busbar, the second busbar, the third busbar, and the fourth busbar extend is a direction of a width of each of the first common busbar, the second common busbar, the first busbar, the second busbar, the third busbar, and the fourth busbar, and the width of the first common busbar is narrower than at least one of the first busbar and the third busbar, and the width of the second common busbar is narrower than at least one of the second busbar and the fourth busbar.

8. The elastic wave resonator according to claim 1, wherein the first common busbar and the second common busbar are thinner than the first busbar, the second busbar, the third busbar, and the fourth busbar.

9. The elastic wave resonator according to claim 1, wherein:
the first interdigital transducer electrode includes a plurality of electrode fingers that are interdigitated with each other;
the second interdigital transducer electrode, the third interdigital transducer electrode, and the fourth interdigital transducer electrode each include a plurality of electrode fingers that are interdigitated with each other;
a width of a portion in which the electrode fingers adjacent to or in a vicinity of each other of the first interdigital transducer electrode overlap when viewed in the elastic-wave propagation direction is an interdigital width of the first interdigital transducer electrode and where a width of a portion in which the electrode fingers adjacent to or in a vicinity of each other of each of the second interdigital transducer electrode; and
the third interdigital transducer electrode, and the fourth interdigital transducer electrode overlap when viewed in the elastic-wave propagation direction is an interdigital width of a corresponding one of the second interdigital transducer electrode, the third interdigital transducer electrode, and the fourth interdigital transducer electrode;

the length of the first common busbar is greater than a sum of the interdigital width of each of the first interdigital transducer electrode and the third interdigital transducer electrode; and
the length of the second common busbar is greater than a sum of the interdigital width of each of the second interdigital transducer electrode and the fourth interdigital transducer electrode.

10. The elastic wave resonator according to claim 1, wherein an electrical resistance of the first reflector is lower than an electrical resistance of each of the first common busbar and the second common busbar.

11. The elastic wave resonator according to claim 1, wherein:
the first reflector includes the plurality of electrode fingers; and
a volume of each of the first common busbar and the second common busbar is smaller than a sum of a volume of all of the electrode fingers of the first reflector.

12. A band pass filter comprising:
a first filter portion that is the elastic wave resonator according to claim 1;
at least one second filter portion other than the first filter portion; and
an input terminal; wherein
the first filter portion is disposed closest to the input terminal.

13. The band pass filter according to claim 12, wherein:
the band pass filter includes a plurality of serial arm resonators and a plurality of parallel arm resonators;
the first filter portion includes a first serial arm resonator of the plurality of serial arm resonators; and
the second filter portion includes the plurality of serial arm resonators other than the first serial arm resonator and the plurality of parallel arm resonators.

14. The band pass filter according to claim 13, wherein a first parallel arm resonator of the plurality of parallel arm resonators is connected between a connection between the first serial arm resonator and a second serial arm resonator of the plurality of serial arm resonators and a ground potential.

15. A duplexer comprising:
a first band-pass filter including a first filter portion and at least one second filter portion other than the first filter portion, the first filter portion being the elastic wave resonator according to claim 1;
a second band-pass filter having a pass band different from a pass band of the first band-pass filter; and
an antenna terminal connected to the first band-pass filter, the second band-pass filter, and an antenna; wherein
the first filter portion in the first band-pass filter is disposed closest to the antenna terminal.

16. The duplexer according to claim 15, wherein the second band-pass filter includes an output terminal, a longitudinally coupled resonator-type elastic wave filter, and at least one resonator.

17. The elastic wave resonator according to claim 1, wherein the first and third interdigital transducer electrodes are arranged on an opposite side of the first reflector from the second and fourth interdigital transducer electrodes.

18. The elastic wave resonator according to claim 1, wherein the first and second common busbars have a same or substantially a same potential.

19. The elastic wave resonator according to claim 1, wherein the first common busbar has a different potential from a potential of the first and third busbars.

20. The elastic wave resonator according to claim 1, wherein the second common busbar has a different potential from a potential of the second and fourth busbars.

* * * * *